United States Patent
Zumberger et al.

(10) Patent No.: US 9,238,242 B2
(45) Date of Patent: *Jan. 19, 2016

(54) SMART SOLENOID COMPOUND GUN DRIVER AND AUTOMATIC CALIBRATION METHOD

(71) Applicant: Stolle Machinery Company, LLC, Centennial, CO (US)

(72) Inventors: Neil A. Zumberger, Sidney, OH (US); Steven W. Holt, Sidney, OH (US)

(73) Assignee: Stolle Machinery Company, LLC, Centennial, CO (US)

( * ) Notice: Subject to any disclaimer, the term of this patent is extended or adjusted under 35 U.S.C. 154(b) by 6 days.

This patent is subject to a terminal disclaimer.

(21) Appl. No.: 14/307,915

(22) Filed: Jun. 18, 2014

(65) Prior Publication Data

US 2014/0299675 A1 Oct. 9, 2014

Related U.S. Application Data

(63) Continuation of application No. 13/471,782, filed on May 15, 2012, now Pat. No. 8,794,547.

(51) Int. Cl.
| | |
|---|---|
| *B05B 1/30* | (2006.01) |
| *B05B 15/00* | (2006.01) |
| *B05B 9/01* | (2006.01) |
| *B05B 12/00* | (2006.01) |
| *G01R 35/00* | (2006.01) |
| *G01F 25/00* | (2006.01) |
| *G01F 13/00* | (2006.01) |

(52) U.S. Cl.
CPC .............. *B05B 15/00* (2013.01); *B05B 1/3013* (2013.01); *B05B 9/01* (2013.01); *B05B 12/00* (2013.01); *G01F 13/00* (2013.01); *G01F 25/0092* (2013.01); *G01R 35/005* (2013.01); *Y10T 29/49004* (2015.01)

(58) Field of Classification Search
CPC ...... B05B 9/01; B05B 12/002; B05B 1/3013; B05B 7/2478; F16K 27/065
USPC .............................. 239/583, 584, 569, 67, 71
See application file for complete search history.

(56) References Cited

U.S. PATENT DOCUMENTS

| | | | |
|---|---|---|---|
| 5,749,969 A | 5/1998 | Kobak et al. | |
| 5,755,884 A | 5/1998 | Buckler et al. | |
| 5,945,160 A | 8/1999 | Kobak et al. | |
| 6,380,861 B2 | 4/2002 | Estelle et al. | |
| 7,289,878 B1 | 10/2007 | Estelle et al. | |
| 8,794,547 B2 * | 8/2014 | Zumberger et al. | 239/583 |
| 2008/0217437 A1 | 9/2008 | Vanden Berghe et al. | |
| 2011/0121103 A1 | 5/2011 | Carleton et al. | |

* cited by examiner

*Primary Examiner* — Davis Hwu
(74) *Attorney, Agent, or Firm* — Eckert Seamans Cherin & Mellott, LLC; David C. Jenkins

(57) ABSTRACT

A device for calibrating a spray gun and an associated method are provided. The spray gun has a nozzle that is opened and closed by moving an internal needle out of and into sealing engagement with the nozzle. A virtual position of the needle is tracked and recorded by the control system. The control system is recalibrated when the virtual position and the actual position of the needle do not correspond. The device includes a sensor structured to detect characteristics of the current used to power the solenoid, and to identify an anomaly in solenoid current characteristics associated with an actuator member seating against said solenoid. During calibration, the solenoid is placed in a calibration configuration and the identifiable anomaly is detected. When the identifiable anomaly is detected, the spray gun is returned to an initial configuration and the virtual needle position is reset.

20 Claims, 2 Drawing Sheets

SMART SOLENOID COMPOUND GUN DRIVER AND AUTOMATIC CALIBRATION METHOD

CROSS REFERENCE TO RELATED APPLICATION

This application is a continuation application and claims priority to U.S. patent application Ser. No. 13/471,782, filed May 15, 2012., entitled "Smart Solenoid Compound Gun Driver and Automatic Calibration Method."

BACKGROUND OF THE INVENTION

1. Field of the invention

The disclosed and claimed concept relates to a system utilizing a nozzle, which is closed by an internal needle, structured to dispense liquids and, more specifically, to a system for calibrating the needle lift relative to the nozzle body.

2. Background Information

Certain fluid dispensing systems are structured to dispense a liquid that is less viscous when hot. If the liquid is allowed to cool, the viscosity increases making it more difficult to apply the liquid in a controlled and/or consistent manner. Such liquid dispensing systems may utilize nozzle assemblies, or "spray guns" that are closed by an internal needle. The liquid may be a sealant or an adhesive. The remainder of this description shall use an adhesive as an example, but it is understood that the liquid is not limited to an adhesive. Generally, an adhesive is either a solvent-based adhesive or a water-based adhesive. In some aspects, the spray gun is adapted to a specific type of type of adhesive. For example, a solvent-based system will include a temperature control to maintain the temperature of the liquid. The spray gun includes a housing that defines a chamber with a nozzle. The chamber includes a liquid inlet and may contain a liquid outlet. The liquid flows into the chamber via the liquid inlet. The liquid may be stored, briefly, in the chamber before application. For a water-based adhesive, the liquid is, typically, expelled exclusively via the nozzle. For a solvent based adhesive, a portion of the liquid may be dispensed via the nozzle and any excess liquid that may be recycled exits the chamber via the outlet. The liquid may then be drained from the system, or, reheated and re-circulated. In this configuration, the liquid in the chamber may be maintained at a temperature that allows for a known, consistent flow rate. Typically, the liquids dispensed by such spray guns must be maintained in a very limited temperature range while in the spray gun liquid chamber.

The nozzle defines an internal passage having a generally frusto-conical shape, i.e. a frustum. The nozzle further includes an internal seat; the seat may be part of the internal surface of the nozzle. A needle having its longitudinal axis aligned with the axis of the nozzle passage is used to seal the passage. That is, the needle coupled to an actuator structured to move the needle in an axial direction; i.e. longitudinally. The needle proximal end is coupled to the actuator and the opposite end of the needle distal tip is shaped generally, or substantially, to correspond to the shape of the nozzle seat. When the needle is in a forward, first position, the needle distal tip sealingly engages the nozzle seat. In this configuration, the spray gun is closed. When the needle is in a retracted, second position, the needle distal tip is fully spaced from the nozzle seat. In this configuration, the spray gun is open. The distance between the needle and the seat is identified as the "needle lift." Further, and as described below, the needle may also be placed anywhere between the first and second position, thereby causing the nozzle to be partially open. That is, when the needle is in the second position, i.e. fully spaced from the nozzle internal passage, the nozzle is, essentially, unblocked and allows for the nozzle's maximum flow rate. It is noted that, while in the second position, the needle may be disposed within the nozzle internal passage, so long as the nozzle achieves its maximum intended flow rate. If the needle is somewhere between the first and second positions, the nozzle is partially open and the liquid flows at a rate less than the maximum flow rate.

Typically, such spray guns must be opened and closed both rapidly and intermittently. That is, the nozzle is cyclically opened a brief period of time, then closed for a brief period of time. This would allow, for example, a quantity of sealant to be applied to an object while the spray gun is open, then for the object to be moved and replaced while the spray gun is closed. This is useful for an automated process or assembly line wherein objects such as, but not limited to, cans or shells are moved through the fluid dispensing system.

Many nozzle assemblies of this design utilize a solenoid to move the needle between the first and second positions. There are at least two problems with such solenoids. First, the solenoids are disposed relatively close to the nozzles. This is a problem because the current that causes the rapid opening and closing of the spray gun also causes the solenoid to heat up. Because the solenoid is close to the spray gun liquid chamber, the liquid in the chamber may become heated. Further, changes in ambient temperatures may vary greatly. As noted above, the liquids dispensed by such spray guns must be maintained in a very limited temperature range while in the spray gun liquid chamber. Thus, the heat added to the liquid by the solenoid may raise the liquid above the desired temperature. Further, such solenoids typically have only two configurations; when the solenoid is charged, the needle is placed in the second, fully open position. When the solenoid is not charged, a spring or a similar device returns the needle to the first, closed position. Thus, there was no means to allow for a partial flow of the liquid.

As shown in U.S. Pat. No. 5,945,160, this later disadvantage was addressed by controlling the needle solenoid with two stepping solenoids, an opening stepping solenoid and a closing stepping solenoid. The stepping solenoid rod was coupled to the needle solenoid and moved the needle solenoid forward and aft in the spray gun housing. Rather than using a charged coil, and possibly a spring, to move a rod forward and back, a stepping solenoid uses a charge to incrementally move a rod in one direction. That is, each incremental movement was a "step." The incremental motion may be achieved by rotating a rod disposed in a threaded bore as opposed to moving the rod axially. That is, a stepping solenoid may include a fixed threaded bore and the solenoid rod may have a threaded portion engaged therewith. Actuation of the stepping solenoid coil causes the solenoid rod to rotate a portion of a revolution, i.e. the increment noted above. This rotation causes the solenoid rod to move axially relative to the fixed threaded bore. Thus, the solenoid rod may be moved incrementally axially. That is, a single actuation of the stepping solenoid coil causes the solenoid rod to rotate over an arc, e.g. 5 degrees. Multiple actuations therefore cause the solenoid rod to move over multiple arcs, in this example, arcs of 5 degrees each. Each partial rotation of the rod moves the rod axially relative to the threaded bore. Thus, the stepping solenoid rod may be "stepped" forward. Use of a second stepping solenoid allows for movement in the other direction, i.e. the solenoid rod may be stepped backward. As such, the position of the needle solenoid in the spray gun housing, and therefore the position of the needle, could be adjusted.

Such stepping solenoids are useful as the needle lift may be changed during the use of the spray gun. For example, assume a spray gun is inactive at night. When the spray gun is first used in the morning, it is cold and the heated liquid being applied by the spray gun is not affected by the spray gun temperature. With the liquid at this temperature, the needle lift should be 0.035 inch. As the day goes on, the ambient temperature increases, thereby raising the temperature of the liquid. By noon, the stored liquid is less viscous and, to achieve the same results as in the morning, the needle lift needs to be reduced to 0.015 inch. This type of adjustment cannot be accomplished with traditional, non-stepping solenoids. A system having a stepping solenoid can make such an adjustment.

The stepping solenoids typically respond to an input in the form of a pulse. That is, the stepping solenoids are energized, and therefore move one increment, in response to receiving a single pulse of energy. This energy may be supplied directly to the solenoid coil, or may be used to open and close a circuit that energizes the solenoid coil. For each pulse received, the solenoid moves one increment or step. Thus, to move the solenoid rod and needle a selected distance, e.g. 0.015 inch, the stepping solenoid would have to receive thirty pulses. The actuator control system records the number of pulses sent to each stepping solenoid thereby tracking the position of the needle.

While this type of spray gun allowed for greater control of the liquid flow rate, i.e. by allowing the needle to be placed in multiple partially open configurations, another problem developed; the needle was not always where the actuator control system "believed" it to be. That is, the actuator control system's record of where the needle was positioned was not always accurate. The actuator control system includes a memory and a processor, hereinafter a programmable logic circuit (PLC), or similar device structured to execute a series of instructions. The memory includes the instructions for the PLC, typically stored in "modules," as well as data stored in a register. Some of the stored data includes data representing the "virtual" needle position. That is, a virtual needle position module correlates the change in needle position with the recorded number of pulses sent to each stepping solenoid. Alternatively, the data could be compiled in a virtual" needle position database that correlates a number of pulses with a virtual needle position, e.g.:

| Number of Pulses | Needle Lift in Inches (Virtual Needle Position) |
|---|---|
| 1 | 0.0005 |
| 2 | 0.0010 |
| 3 | 0.0015 |
| 4 | 0.0020 |
| 5 | 0.0025 |

Thus, rather than calculating the needle position, the virtual needle position module could just record the type (i.e. forward or backward motion) and number of pulses sent and then look up the corresponding virtual needle position.

For example, assume the virtual needle position module correlates each pulse with a needle lift of 0.0005 in. Further assume the needle starts in the first position. If the opening stepping solenoid was sent thirty pulses and the closing stepping solenoid 100A was sent fifteen pulses, the needle position module would record the needle as having a needle lift of 0.0075 in. That is, a movement of 0.0005*30=0.015 in. away from the needle seat and 0.0005*15=0.0075 toward the needle seat totals a needle lift of 0.0075 in. The recorded needle position is identified as "virtual" as the actuator control system cannot verify that the needle is actually 0.0075 in. from the nozzle seat. In fact, many times the needle does not have a needle lift matching the "virtual" needle position.

This offset between the virtual needle position and the actual needle position was caused by various factors. For example, the manufacturing tolerances of the various spray gun components is in the range of about +/−0.0001 to +/−0.0005 inch. Thus, during assembly of the gun, the stacking of tolerances may create an error as to the actual position of the needle. Further, the initial measurement of needle lift was performed manually, which could also be in error. For example, the operator could make an error in the actual measurement, an error in entering the manual measurement data, or may even forget to enter the data into the control PLC. Additionally, the gun may, for many reasons, fail to operate, e.g. advance or retract the needle, in a controlled manner. Thus, either from the initial usage or developing over time, the virtual needle position and the actual needle position may not be the same. This is a disadvantage as movement of the needle is based upon the data representing the virtual needle position.

Manufacturers of spray guns recommend that regular maintenance be performed on the spray gun nozzles to recalibrate the needle lift. This operation typically requires that the spray gun be taken offline so that the actual needle lift may be measured. This data is then incorporated into the virtual needle position database. This procedure is time consuming, requires an expensive external calibration device, and requires cleaning the spray gun to remove the sealant. As such, users have been known to recalibrate a spray gun by unapproved methods such as forcing the needle forward and resetting the virtual position. That is, the users actuate the closing stepping solenoid for a period causing the needle to move forward. After a short, but indeterminate period of time, the needle engages the seat. As the user does not know when this occurs exactly, the user typically allows the closing stepping solenoid to continue operating. This continued forward motion of the needle may cause damage to the needle, the nozzle seat, and the closing stepping solenoid. Once, the user stops the closing stepping solenoid, the virtual needle position database is updated to indicate that the current needle position is the first position.

SUMMARY OF THE INVENTION

The disclosed and claimed concept provides for a system and method for calibrating needle lift in a spray gun assembly. The system includes the actuator control system having a user input device, a processor and memory as well as an actuator sensor structured to detect changes in the current in at least one actuator line conductor and to provide an output signal. That is, the at least one actuator line conductor is the conductor that supplies power to the at least one actuator. The actuator sensor is structured to detect changes in the current characteristics over time in the at least one actuator line conductor. In the preferred embodiment, the characteristic that is measured is a change in inductance; It is understood, however, the other current characteristics may be monitored. More specifically, the at least one actuator has a specific response when the needle engages the nozzle seat that causes an identifiable anomaly in the current output signal. When this identifiable anomaly is detected, the actuator control system arrests the forward motion of the needle, i.e. disengages the at least one actuator. Further, the actuator control system updates the virtual needle position so as to indicate that the needle's current position is the closed first position. This operation recalibrates the actual position of the needle with the virtual position of the needle.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

As used herein, and when used in reference to communicating data or a signal, "in electronic communication" includes both hardline and wireless forms of communication. It is further understood that "in electronic communication" includes indirect communication of data and signals that are converted to different formats so long as the identified components communicate. For example, if a sensor produces an analog signal that a modulator converts to a digital format, and the digital data is communicated to a processor, the sensor and the processor are "in electronic communication."

As used herein, "coupled" means a link between two or more elements, whether direct or indirect, so long as a link occurs.

As used herein, "directly coupled" means that two elements are directly in contact with each other.

As used herein, "fixedly coupled" or "fixed" means that two components are coupled so as to move as one while maintaining a constant orientation relative to each other. The fixed components may, or may not, be directly coupled.

As used herein, the word "unitary" means a component is created as a single piece or unit. That is, a component that includes pieces that are created separately and then coupled together as a unit is not a "unitary" component or body.

Figure 1:
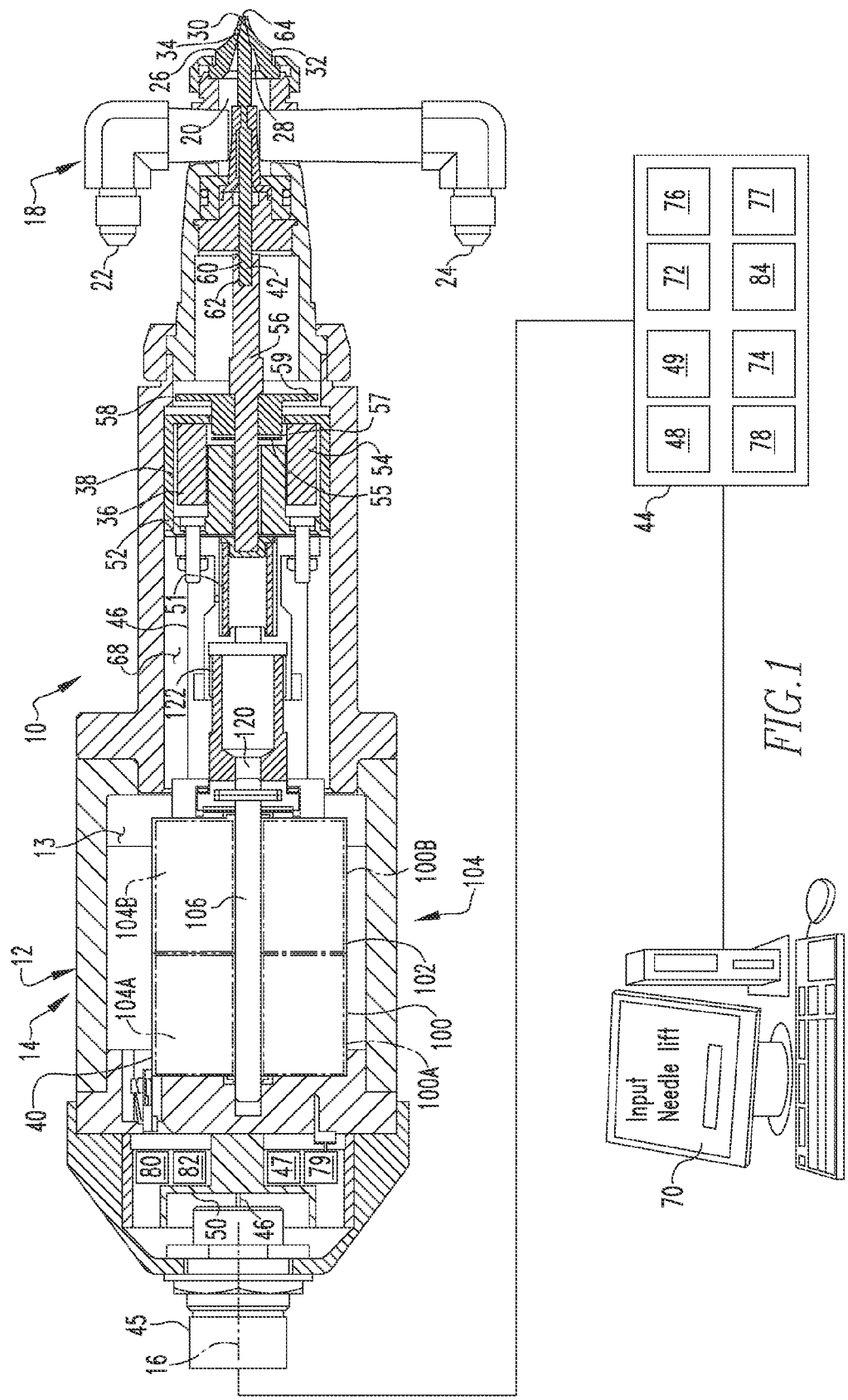
FIG. 1 is a schematic view of a spray gun and actuator control system.
Figure 2:
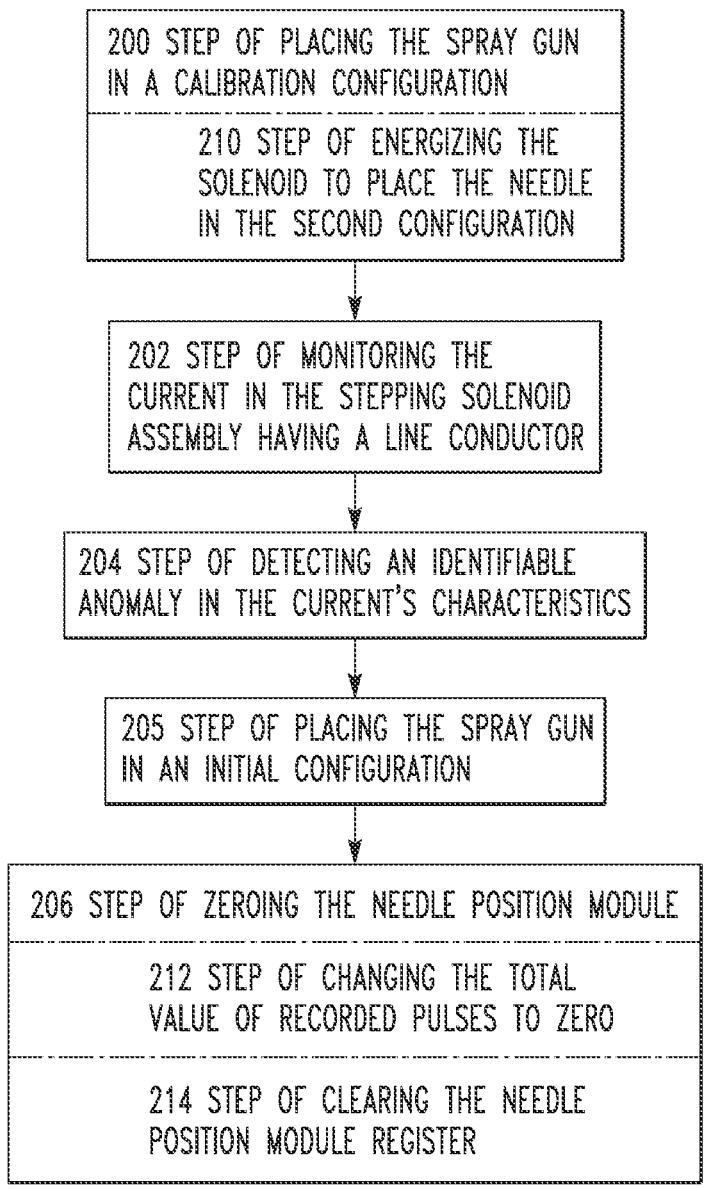
FIG. 2 is a flow chart showing the steps of the method associated with use of the spray gun.

As shown in FIG. 1, a spray gun 10 includes a housing 12 defining an enclosed. space 13, and an operating mechanism 14, Preferably, the spray gun housing 12 is elongated and has a longitudinal axis 16. The spray gun housing 12 defines at least a fluid chamber 20 and preferably defines an operating mechanism chamber 68 as well. The fluid chamber 20 and the operating mechanism chamber 68 are sealed from each other so that no fluid may pass from the fluid chamber 20 to the operating mechanism chamber 68. The fluid chamber 20 has a fluid inlet 22 and a nozzle 26. Further, the fluid chamber 20 may have an excess fluid outlet 24, The fluid inlet 22 and the excess fluid outlet 24 are each coupled to, and in fluid communication with, a liquid product delivery/circulation system 18. The liquid product delivery/circulation system 18 delivers a liquid product to the fluid chamber 20 via the fluid inlet 22. If there is a need for recirculation of the liquid, the excess liquid product exits the fluid chamber 20 via the excess fluid outlet 24.

The nozzle 26 defines a passage 28 that is in fluid communication with the fluid chamber 20 and the space outside of the spray gun housing 12. That is, the nozzle passage 28 terminates at an opening 30. Preferably, the nozzle 26 has a body 32 with a generally gusto-conical shape. Further, the nozzle passage 28, or the portion of the nozzle passage 28 immediately adjacent the nozzle opening 30, also may have a frusto-conical shape. The nozzle passage 28 about the nozzle opening 30 defines a needle seat 34. The needle seat 34 is structured to be seatingly engaged with the needle body distal end 64 as described below.

In this configuration, the liquid product may flow into the fluid chamber 20 via the fluid inlet 22. The liquid product, or a portion thereof, may pass through the nozzle 26 and be applied to a work piece (not shown). Again, if there is a need for recirculation of the liquid, the remainder of the liquid product exits the fluid chamber 20 via the excess fluid outlet 24 and may be re-circulated.

The operating mechanism 14 has at least two electrically powered actuators 36, 40, a needle 42 and an actuator control system 14. It is noted that actuator control system 44 and related components, such as, but not limited to, modules, memory, and PLCs, are all shown schematically. Further, actuator control system 44 is shown as an external unit. That is, actuator control system 44 is shown outside of the solenoid housing 52. It is understood that actuator control system 44 may be disposed inside or outside, or partially inside, the solenoid housing 52 or the spray gun housing 12. It is further noted that actuator control system 44 is shown as a single unit. As is known, however, the actuator control system 44 may be several elements, each disposed in separate locations. For example, a system 80 for calibrating needle lift and an actuator sensor 82, each described below and each of which are part of the actuator control system 44, are shown as being incorporated into amplifier 50 (described below).

Each of the at least two actuators 36, 40 has a line conductor 46 (shown schematically) structured to be in electrical communication with a power source (not shown). The at least two actuators 36, 40 include a solenoid 38 and, preferably, a stepping solenoid assembly 100. As is known, a solenoid 38 includes a housing 52, a spring 51, and a coil assembly 54 disposed about a solenoid rod 56. The solenoid rod 56 is a magnetic member that is movably, i.e. slidably, coupled to the solenoid housing 52 and extends partially therein. The solenoid spring 51 biases the solenoid rod 56 rod to an extended, first position, i.e., the solenoid rod 56 is substantially out of the solenoid housing 52. The axis of the solenoid rod 56 is substantially disposed on the housing longitudinal axis 16. The solenoid coil assembly 54 is disposed within the solenoid housing 52 and is partially disposed about, but not directly coupled to, the solenoid rod 56. Energizing the coil assembly 54 creates a magnetic field that draws the solenoid rod 56, partially, into the housing 52; this is the withdrawn, second position of the solenoid rod 56. The solenoid rod 56 moves between a first and second position; the distance the solenoid rod 56 travels is the "stroke" and is a characteristic of the solenoid 38. That is, the stroke generally cannot be changed and is a known distance. When the coil assembly 54 is not energized, the solenoid spring 51 maintains the solenoid rod 56 in the first position. Further, because the length of the stroke is known, the spray gun 10 may be placed in an "initial configuration." As used herein, the "initial configuration" of the spray gun 10 is when the solenoid 38 is positioned within the spray gun housing 12 so that the needle 42 seals against the needle seat 34 at the end of the solenoid stroke. That is, the solenoid 38 is at substantially the exact distance from the needle seat 34 as the stroke so that the needle distal end 64 (described below) sealingly engages the needle seat 34 at the end of the solenoid stroke. It is noted that, if the solenoid 38 is too close to the needle seat 34, the spring 51 will bias the needle distal end 64 against the needle seat prior to the end of the stroke.

As shown, the solenoid 38 may include an actuator member 58 disposed about the solenoid rod 56. The solenoid actuator member 58 is made from a material that is attracted to magnetic fields. The solenoid actuator member 58 acts as a mass capable of being influenced by a magnetic field. Thus, when the coil assembly 54 is energized, there is a strong magnetic influence on the solenoid actuator member 58 and solenoid rod 56 that draws the solenoid rod 56 into the solenoid housing 52. Further, the solenoid actuator member 58 extends partially into the solenoid housing 52. The solenoid actuator member 58 has an inner end 57 within the solenoid housing 52. Between the solenoid actuator member inner end 57 and other elements of the solenoid 38 is a spacing device, which is typically a washer, hereinafter the solenoid washer 55. When the solenoid 38 is energized, the solenoid actuator member 58 is drawn into the solenoid housing 52 until the solenoid actuator member 58 engages the solenoid washer 55. That is, the solenoid actuator member 58 bottoms out against the solenoid washer 55. This engagement limits the length of travel, i.e. the stroke, of the solenoid rod 56. That is, once the actuator member 58 bottoms out against the solenoid washer 55, the actuator member 58, and therefore the solenoid rod 56, has moved the maximum distance into the solenoid housing 52. Further, the solenoid actuator member 58 may include a flange 59 structured to engage, i.e. contact, the solenoid housing 52. As discussed in detail below, the entire solenoid 38 is movably disposed in the spray gun housing 12. Further, the solenoid housing 52 may include a threaded coupling 122, located adjacent to the stepping solenoid 100.

The needle 42 has an elongated body 60 having a proximal end 62 and a distal end 64. The needle proximal end 62 is coupled to the solenoid rod 56. The needle distal end 64 is shaped to correspond to the shape of the needle seat 34. Preferably, the needle distal end 64 is conical. The needle distal end 64 is disposed adjacent to the needle seat 34. It is noted that the frusto-conical shape of the nozzle 26 and the needle 42 are preferred, but not required. As is known, the needle 42 may have a spherical member (not shown) at the distal end and the nozzle opening 30 may have an annular seat (not shown) disposed thereabout. In this configuration, the needle 42 moves axially with the solenoid rod 56 substantially along the housing longitudinal axis 16. The distance the needle 42 moves is equivalent to the stroke of the solenoid rod 56.

Thus, in this configuration, the needle 42 moves between a first, closed position, n the solenoid rod 56 is being biased toward the nozzle 26 by the solenoid spring 51, and a second, open position, wherein the solenoid rod 56 has been drawn away from the nozzle 26 by energizing the coil assembly 54. When the needle 42 is in the first, closed position, the needle body distal end 64 sealingly engages the nozzle seat 34. Further, as the stroke of solenoid 38 is known, the distance of needle body 60 travels is a fixed distance. Thus, but for manufacturing errors, thermal expansion, and other factors, the "needle lift," i.e. the distance between the needle distal end 64 and the needle seat 34 when the needle body 60 is in the second position is fixed. As discussed below, however, the actual needle position may be difficult to track.

Further, it is noted that rotation of the solenoid 38 may be prevented by various known methods such as, but not limited to, providing a keyed shape or having an anti-rotation lug (not shown). For example, the solenoid housing 52 and the interior of the spray gun housing 12 may have a cross-sectional shape that is other than circular; in this configuration the elements are "keyed" in that they may not rotate relative to each other. Alternatively, a lug (not shown) may extend from the inner surface of the operating mechanism chamber 68 into the solenoid housing 52. In this configuration, solenoid 38 may move axially in the spray gun housing 12, but not rotate.

A stepping solenoid assembly 100 operates in a slightly different manner. That is, a stepping solenoid assembly 100 is structured to cause a solenoid rod 106, or an actuator fixed to the solenoid rod 106, to rotate. A stepping solenoid 100 also has a housing 102, a coil assembly 104 disposed about a rotatable solenoid rod 106. It is understood that actuator (not shown) may be fixed to the rotatable solenoid rod 106. One type of stepping solenoid assembly 100 includes a coil assembly 104 and solenoid rod 106 each having a number of radial peaks (not shown) or similar structure, disposed about their inner and outer circumference, respectively. The inwardly extending radial elements extend to a point close to, but not in contact with, the tips of a sprocket (not shown) fixed to the solenoid rod 106. The coil assembly 104 includes at least two, and typically three, separate coils (not shown) of wire, each capable of being independently energized. The separate coils are each coupled to alternate, or more typically sequential and repeating sets of inwardly extending radial elements, e.g. one set of radial elements are associated with each coil. In this configuration, the magnetic force created when one coil in the stepping solenoid coil assembly 104 is energized is concentrated in the associated set of the extending radial elements. This magnetic force causes the tips of the stepping solenoid sprocket to move toward that set of inwardly extending radial elements. When the next coil is energized, the next set of inwardly extending radial elements become magnetic and draws the tips of the stepping solenoid sprocket to move toward that set of inwardly extending radial elements. By sequentially energizing the coils, the magnetic effect on the stepping solenoid sprocket causes the stepping solenoid rod 106 to rotate.

Alternatively, the stepping solenoid rod 106 may move axially, but be coupled to a disk (not shown) having one or more arcuate races (not shown) therein. The races are shallow at one end and deeper at the other. A bearing (not shown), such as but not limited to a ball bearing, is disposed in the race. The disk is disposed adjacent to the stepping solenoid housing 102. When the stepping solenoid assembly 100 is actuated, the disk is drawn toward the stepping solenoid housing 102; this causes the bearings to move into the deeper portion of the races which, in turn, causes the disk to rotate; that is, the hearings actually maintain a generally stationary position relative to travel in the stepping solenoid housing 102, but, as the bearings are biased toward the deeper part of the arcuate races, the disk rotates positioning a deeper part of the races over the bearings. A ratchet, or similar construct, (not shown) disposed between the stepping solenoid rod 106 and the disk is used to prevent counter-rotation when the stepping solenoid assembly 100 is de-energized.

These types of stepping solenoid assemblies 100 are exemplary and this disclosure is not limited to any specific type of stepping solenoid assembly 100. Any stepping solenoid assembly 100, however, is structured to cause a stepping solenoid rod 106 to rotate over an arc when the coil assembly 104 is energized.

Preferably, the stepping solenoid assembly 100 includes two stepping solenoids, i.e. a first and second stepping solenoid 100A, 100B, having a common solenoid rod 106. Preferably, the stepping solenoid rod 106 is substantially aligned with the spray gun housing 12 longitudinal axis 16 and nozzle opening 30. The two stepping solenoids 100A, 100B may also share a housing 102. The first stepping solenoid coil assembly 104A is structured to cause the common solenoid rod 106 to rotate in a first direction and the second stepping solenoid coil assembly 104B is structured to cause the common solenoid rod 106 to rotate in a second direction. Thus, the stepping solenoid assembly 100 is bi-directional, i.e. structured to rotate the stepping solenoid rod 106 in two directions. In an alternate embodiment, a single stepping solenoid assembly 100 is a bi-directional stepping solenoid assembly 100. For example, a stepping solenoid assembly 100 may be structured so that current may be passed in two directions through the coil assembly 104 thereby causing the stepping solenoid rod 106 to rotate in a direction associated with the direction of the current.

If the stepping solenoid assembly 100 is the type wherein the stepping solenoid rod 106 only rotates, i.e. the embodiment wherein arcuate races are not used, the stepping solenoid rod distal end 120 may be threaded, i.e. the end of the stepping solenoid rod 106 extending out of the stepping solenoid housing 102 may be threaded. The stepping solenoid rod threaded distal end 120 is structured to thread into the solenoid housing threaded coupling 122. As noted above, the solenoid 38 is movably disposed in the spray gun housing 12 but also prevented from rotating. That is, the solenoid 38 is structured to slide axially in the spray gun housing 12. In this configuration, the stepping solenoid rod 106 rotates but does not move axially and the solenoid 38 is structured to slide axially but not rotate. Thus, when stepping solenoid rod threaded distal end 120 rotates in solenoid housing threaded coupling 122, the solenoid 38 to move axially.

If stepping solenoid assembly 100 has a disk-like actuator, i.e. a stepping solenoid assembly 100 wherein the stepping solenoid rod 106 moves axially as well as rotates, the stepping solenoid rod distal end 120 may be pinned to solenoid 38. That is, solenoid 38 and stepping solenoid rod distal end 120 are structured to abut each other, or otherwise maintain a fixed spacing. The coupling between solenoid 38 and stepping solenoid rod distal end 120, however, allows stepping solenoid rod 106 to rotate. It is again noted that solenoid 38 is structured to slide axially but not rotate. Thus, in this configuration, actuation of the stepping solenoid assembly 100 causes solenoid 38 to move axially as stepping solenoid rod 106 moves axially.

Thus, actuation of the stepping solenoid 100 causes the entire solenoid 38 to move forward or backward in the operating mechanism chamber 68, thereby allowing adjustment and/or recalibration of the needle position. That is, actuation of the first or second stepping solenoid 100A, 100B causes the stepping solenoid rod 106 to rotate in one direction. As the stepping solenoid rod 106 is coupled to the solenoid 38, either threadably or in a fixed relationship, and because the solenoid 38 is non-rotably, but slidably, disposed in the spray gun housing 12, actuation of the first or second stepping solenoid 100A, 100B causes the solenoid 38 to slide within the spray gun housing 12. Moreover, the solenoid 38 moves over a path generally aligned with the housing axis 16. For the purpose of this application, it is assumed that actuation of the first stepping solenoid 100A causes the solenoid 38 to move away from the nozzle 26 and actuation of the second stepping solenoid 100B causes the solenoid 38 to move toward the nozzle 26. As the needle body 60 is coupled to the solenoid 38, adjusting the position of the solenoid 38 also adjusts the position of the needle body 60.

Preferably, a charge is applied to the stepping solenoid coil assembly 104, in pulses. For each pulse, the solenoid rod 56 rotates a discrete increment or "step." Thus, the stepping solenoid rod 106 moves in discrete increments or "steps." It is noted that the axial distance that the solenoid rod 56 moves may be controlled by adjusting the pitch of the threads in the solenoid housing threaded coupling 122. In the preferred embodiment the solenoid rod 56 moves axially between about 0.001 and 0.0005 inch per step and, more preferably, about 0.0005 inch per step. Further, it is noted that the pulses may be provided to the stepping solenoid coil assembly 104 directly from the actuator control system 44 via the at least one actuator line conductor 46, meaning that the actuator control system 44 is the power source, or, the at least one actuator line conductor 46 may be coupled to a power system (not shown) and the actuator control system 44 may control a switch (not shown) disposed between the power system and the at least one actuator line conductor 46. Preferably, there is an amplifier 50, which is part of the actuator control system 44, which is disposed between the stepping solenoid coil assemblies 104A, 104B and other parts of the control system 44, such as the PLC 48 (discussed below). Further, as discussed below, the amplifier 50 includes a control system having at least a memory 47.

Further, and depending upon which stepping solenoid 100A, 100B is actuated, the pulses may be said to have an associated "direction." That is, the pulses may cause the solenoid 38, and therefore the needle body 60, to move away from the nozzle opening 30 or toward the nozzle opening 30. As used herein, an "opening pulse" is a pulse that actuates the opening stepping solenoid 100A. Conversely, a "closing pulse" is a pulse that actuates the closing stepping solenoid 100B causing the solenoid 38 to move toward the nozzle opening 30.

Thus, the solenoid 38 is structured to receive input commands from the actuator control system 44 and to move the needle 42 between the first position and a selected position, or the second position, while the stepping solenoid assembly 100 is structured to receive input commands from the actuator control system 44 and to incrementally move the needle 42. in response to the commands.

That is, the stepping solenoid assembly 100 moves the solenoid 38 within the spray gun housing 12 which, in turn, moves the needle 42. Thus, the stepping solenoid assembly 100 is structured to provide fine adjustment to the needle 42 position. The actuator control system 44 includes one or more PLCs 48 and memory 49. Hereinafter, "PLC" shall mean one or more PLCs 48. The memory 49 includes random access memory (data can be recorded and read) and read only memory (data can be read only) and may be physically embodied by any known memory device such as, but not limited to, integrated circuits (computer chips), flash memory, magnetic memory, optical memory, or disk based memory (CD, DVD, hard drives, etc.). The PLC 48 and memory 49 are in electronic communication with each other.

It is noted that elements of the actuator control system 44 are shown schematically as being separate from the spray gun housing 12 and grouped together for clarity. As is known, however, the elements of the actuator control system 44 may be disposed in, or on, the spray gun housing 12 and may not be grouped together as shown. For example, elements of the actuator control system 44 may be positioned so as to reduce electronic noise and interference. Thus, the claims are not limited to the schematic configuration of the actuator control system 44 as shown. For example, the amplifier 50 is, preferably, disposed in the spray gun housing 12, and more preferably at the end of the spray gun housing opposite the nozzle 26. This end of the spray gun housing 12 may include a communication port or coupling 45.

The operation of a PLC 48 is beyond the scope of this document, however, as is known, a PLC 48 is structured to execute a series of instructions, to receive input, and to provide output. As used herein, the series of instructions are contained in one or more "modules" that are incorporated in the PLC 48 or stored in an associated memory 49. The PLC 48 is structured to read and execute one or more modules substantially simultaneously. Further, it is understood that the actuator control system 44 includes components, such as, but not limited to, one or more timers structured to track or measure time, modulators/demodulators for converting digital signals to analog signals and vice versa, generating video signals or other output signals, etc., that enable the actuator control system 44 to accomplish any function the actuator control system 44 is structured to perform. Again, the details of how a PLC 48 performs these functions is beyond the scope of this document but are known in the art. Further, it is understood that the actuator control system 44 includes any conductors, connectors, etc., that are required to allow the various components to communicate with each other. For example, the actuator control system 44 is disposed adjacent to the amplifier 50 and there is a conductor (not shown) extending therebetween. Similarly, there are conductors (not shown) extending between the amplifier 50 and both the solenoid 38 and the stepping solenoids 100A, 100B.

The actuator control system 44, preferably, further includes a remote user interface 70, a user interface module 72, an actuator control module 74, and a needle position module 76. Typically, the user interface module 72, actuator control module 74, and needle position module 76 (modules shown schematically) are stored in the actuator control system memory 49 and are loaded into the PLC 48 as needed. Alternately, one or more of the modules 72, 74, 76 may be permanently incorporated into the PLC 48. The remote user interface 70 is an interface presented in a manner that may be used by a user. The remote user interface 70 may be presented on any known interface such as, but not limited to, a touch screen, a monitor and keyboard, or, an analog display and manual input devices, e.g. knobs, buttons, switches, etc., on long as the remote user interface 70 allows a user to input a desired needle lift, initiate use of the spray gun 10, terminate use of the spray gun 10, and recalibrate the needle lift, as described below. The user interface module 72 is structured to receive input from a user via the user interface 70 and to communicate that input to the actuator control module 74.

The actuator control module 74 receives input from the user interface module 72 and is structured to put into effect the user's input. The actuator control module 74 cooperates, and communicates, with the needle position module 76 so as to move the needle 42 in accordance with the user input. Thus, for example, the user may cause the solenoid 38 to open and close in a specific pattern. Moreover, the actuator control system 44 in conjunction with the stepping solenoids 100A, 100B may be used to make fine adjustments to the needle position or recalibrate the needle position. This is accomplished by actuating the stepping solenoids 100A, 100B to mechanically move the solenoid 38 toward or away from the nozzle 26, as described above. The mechanical movement of the solenoid 38, i.e. the position of the solenoid 38, and therefore the needle body 60, is tracked by the actuator control system 44.

More specifically, the actuator control system memory 49, and/or the amplifier memory 47, in conjunction with, or as part of the needle position module 76, are utilized as registers to track the number and direction of the pulses sent to the stepping solenoids 100A, 100B and/or the position of solenoid 38. It is assumed that the needle 42 always starts operation in the first position, i.e. closed. That is, the solenoid 38 is in the first position and the needle body distal end 64 is engaging the needle seat 34. When there is a need to make a fine adjustment to the needle body 60 position, the actuator control system 44 sends a number of pulses, or sends a command or signal to a switch that, in turn, sends a number pulses to the at least one actuator 40 causing the needle 42 to move as described above. These pulses may be passed through the amplifier 50. Each pulse and its associated direction is recorded in the needle position module registers 77 within the actuator control system memory 49 and the amplifier memory 47, as discussed below.

For example, during the day, ambient temperatures increase and the viscosity of the fluid may decrease. To ensure the proper amount of liquid is applied, the needle position must be adjusted. In this example, the solenoid 38 needs to be moved forward, i.e. toward the nozzle seat 34, thereby reducing the needle lift when the needle body 60 is in the second position. Before this operation may be accomplished automatically, it may be done manually to determine the amount of adjustment needed. Thus, the solenoid 38 is energized and the needle lift is measured. In this example, the needle lift is assumed to be too great, i.e. the needle body 60 is too far from the needle seat 34 when in the second position, so the closing stepping solenoid 100B is actuated. This causes the solenoid 38 to be moved toward the nozzle seat 34 as described above. The distance that the solenoid 38 needs to be moved may be determined by a manual measurement. After such data is recorded over a period of time, the distance may be selected as the average distance the solenoid 38 is typically moved. Thus, in this example, a user would adjust the needle position forward every day at a certain time or once the ambient temperature reached a selected mark. Further, the amount of adjustment is recorded in the needle position module registers 77. Thus, if the needle position, i.e. the position of the solenoid 38, needed to be reset to the original position, the user merely has to move the solenoid 38 toward the nozzle seat 34 by the same distance, i.e. the same number of pulses but in the opposite direction.

This system may also be used to calibrate the needle position. Before discussing the calibration process, it is noted that the physical elements of the spray gun 10 have known characteristics, such as, but not limited to, dimensions, which do not change. Thus, if the elements of the spray gun 10 are placed in a selected configuration wherein the actual needle position is known, then the actuator control system 44 may be calibrated to this known position. Accordingly, the spray gun 10 has a "calibration configuration" wherein the elements identified below are placed in a specific configuration. The "calibration configuration" is achieved by performing the following steps. First, the closing stepping solenoid 100B is actuated. This causes the solenoid 38 to be moved toward the needle seat 34 as described above. As the solenoid 38 is moved toward the needle seat 34, the solenoid actuator member 58, and more preferably the solenoid actuator member flange 59, engages the spray gun housing 12. When this occurs, the solenoid actuator member 58 can no longer move. Continued actuation of the closing stepping solenoid 100B causes the solenoid 38 to continue to move toward the needle seat 34. The motion of the solenoid 38 causes the solenoid rod 56, and eventually the solenoid actuator member 58, to move into the solenoid housing 52. The motion of the solenoid 38 continues until the solenoid actuator member 58 bottoms out against the solenoid washer 55. That is, solenoid 38 is moved forward until the solenoid actuator member 58 bottoms out against the solenoid washer 55. At this point, the solenoid 38 may not be moved forward anymore. It is further noted that, the solenoid rod 56 is in the second position while the needle 42 still engages the nozzle seat 34. Hereinafter, the act of the solenoid actuator member 58 bottoming out against the solenoid washer 55 shall be identified as "the actuator member 58 seats against the solenoid 38."

This is the "calibration configuration" as the position of all the elements are known. It is noted that the "initial configuration" and the "calibration configuration" both relate to the configuration of the solenoid 18 and a stepping solenoid assembly, i.e. stepping solenoids 100A, 100B, and their relationship to each other. The actuator control system 44 may be calibrated to this known position. That is, the "virtual needle position," which is the where the actuator control system 44 "believes" the needle body 60 to be may be set to correspond with the "actual needle position" that is known when the spray gun 10 is in the "calibration configuration." Further, the difference between the calibration configuration and the initial configuration may be determined by manual measurement. That is, the actuator control system 44 is programmed with a "virtual calibration configuration" that should correspond to the actual needle position when the spray gun 10 is in the calibration configuration.

For example, following multiple manual measurements of the configuration of the spray gun 10 in the calibration configuration, it may be determined that the solenoid 38 is typically moved forward a distance corresponding to fifty forward pulses of the closing stepping solenoid 100B. Thus, the "virtual calibration configuration" relative to the initial position may be recorded as fifty forward pulses. Thus, when the spray gun 10 is in the calibration configuration, the needle position module register 77 may be reset to be at fifty forward pulses (in this example). Alternatively, the spray gun 10 may be returned to the initial configuration following calibration. That is, the actuator control system 44 will cause the opening stepping solenoid 100A to be activated fifty times. At this point, i.e. after the opening stepping solenoid 100A has activated fifty times (in this example) following calibration, spray gun 10 is in the "initial configuration" described above. Further, when the spray gun is in this configuration, the needle position module register 77 may be reset to zero so that the virtual needle position corresponds to the actual needle position, which is the initial configuration. That is, the needle position module register 77 may be reset when the spray gun 10 is in the calibration configuration, wherein the position of the spray gun 10 element is known, or, the needle position module register 77 may be reset to zero immediately following calibration with the spray gun 10 in the initial configuration. The act of resetting the needle position module register 77 is hereinafter identified as "zeroing" the needle position module 76. Calibration is required, or is at least desirable, when the actual needle position no longer corresponds to the virtual needle position.

The needle position module 76 is executed in the actuator control system 44 and is structured to track the "virtual needle position." While this tracking may be made relative to any point, for the sake of this example it will be assumed that the point of reference is a selected open position of the needle 42, i.e. when the solenoid 38 is in the second position and the needle body distal end 64 is separated from the needle seat 34 by the distance of the solenoid 38 stroke. In this configuration, and when the solenoid 38 is not actuated, needle 42 sealingly engages the nozzle seat 34; this is the "zero" configuration or initial configuration for the spray gun 10. Once the spray gun 10 is in the initial configuration, the needle 42 "actual needle position" may be measured as the distance the needle 42 has moved relative to the needle in the first position. That is, the "actual needle position" is measured when the needle body 60 is in the second position. The "virtual needle position" reflects the same "virtual" position, but relies upon the assumption that the movement of the stepping solenoid rod 106, and therefore the needle 42, is exact.

For the sake of this example, it is assumed that the spray gun is initially calibrated. That is, the spray gun 10 is in the initial configuration and the actual needle position corresponds to the virtual needle position. Thus, as the solenoid rod 56 has a predetermined stroke, i.e., a known amount of travel, the needle body 60 second position is known as well. Accordingly, at the start-up of the spray gun 10, the needle actual position is the first closed position and the amount of needle lift when the needle body 60 is in the second position is known. Further, the virtual needle position is initially recorded as being the first closed position. For this example, the needle position module registers 77 are empty, or the stored values total zero, when the spray gun 10 is in the initial configuration. The needle position module 76 may include a database 78 correlating the total value of pulses, i.e. the number of all forward pulses less the number of backward pulses, to a needle position, i.e. a selected needle lift, such as set forth in the table below.

| Number of Pulses | Needle Lift when in the Second Position, in Inches (Virtual Needle Position) |
|---|---|
| 0 | 0.0020 (Needle First Position) |
| 1 | 0.0025 |
| 2 | 0.0030 |
| 3 | 0.0035 |
| 4 | 0.0040 |
| 5 | 0.0045 |

Alternatively, the needle position module 76 may be programmed with a multiplier, e.g. every backward pulse equals an additional needle lift of 0.0005 inch. Thus, the needle position module 76 would only need to record the number of the pulses, and their associated direction (collectively, and as used herein, "needle position data") in order to solve for the virtual needle position. Alternately, the needle position may be tracked by an encoder or Linear Variable Differential Transformer (LVDT).

Regardless of whether the needle position module 76 has a database or calculates the position each time, the needle position module 76 tracks the number of pulses sent to the at least one actuator 40 as well as the direction which the needle 42 is moved. For example, if there are two stepping solenoids 100A, 100B, the needle position module 76 tracks the number of pulses sent to each stepping solenoids 100A, 100B. Based on this information, the needle position module 76 may calculate, or look up, the virtual needle position. Other modules may request this data.

The needle position module 76 records the needle position data in a needle position module register 77 and this information may also be recorded in an amplifier register 79. The needle position module register 77 may record all, or a portion of, the needle position data sent by the actuator control module 74 to the stepping solenoids 100A, 100B. The portion of data recorded may be only the current position of the needle 42. Regardless of how much data is recorded, or the type of data recorded, the needle position data always includes data indicating the current virtual position of the needle 42. For example, and again assuming the needle 42 starts in the first position, the needle position module register 77 may record the needle position data for the last four instructions sent to the stepping solenoids 100A, 100B, e.g. seven forward pulses, five backward pulses, three forward pulses and five more backward pulses. The needle position module 76 may determine the current virtual needle position by summing the number of pulses and multiplying the sum by a multiplier, as noted above. In this example, the sum is zero, so the needle position module 76 would determine that the needle is in the position in which it started, i.e. the virtual first position. This position should correspond with the needle body distal end 64 having a lift corresponding to the solenoid 38 selected stroke when the needle body 60 is in the second position. However, due to various factors identified above, this may not be true.

As a specific example, assume that the stepping solenoids 100A, 100B have each been actuated a number of times so that the position of the needle body 60 in the second position no longer corresponds to the initial position. The needle position module register 77 has recorded the needle position data. Further assume the spray gun 10 operation was interrupted by a power outage and the needle position module register 77 is reset. Thus, following the interruption, the actual needle position no longer corresponds to the virtual needle position. That is, as described, the stepping solenoids 100A, 100B have each been actuated a number of times so that the position of the needle body 60 in the second position no longer corresponds to the initial position, but, the needle position module register 77 is blank, meaning that the data available to the actuator control system 44 indicates that the needle body 60 is in the initial position. That is, the actuator control system 44 "believes" that the needle body 60 is in the initial position. When this occurs, the spray gun 10 needs to be recalibrated.

To do this, the spray gun 10 is placed in the calibration configuration described above. That is, closing stepping solenoid 100B is actuated until the actuator member 58 seats against the solenoid 38. The virtual needle position is then reset as the virtual calibration configuration to reflect the actual configuration, or, the spray gun 10 may be placed in the initial configuration and the needle position module 76 zeroed, as described above.

in the example above, the spray gun 10 was placed in the initial configuration and the needle position module register 77 was zeroed, thereby bringing the actual needle position and the virtual needle position into accord. This process may be accomplished by the spray gun 10 automatically as described hereinafter. The actuator control system 44 may further include a system 80 for calibrating needle lift. The needle lift calibration system 80 includes an actuator sensor 82, a calibration module 84, and the needle position module 76 described above. The actuator sensor 82 is structured to detect changes in characteristics of the characteristics of the current in the at least one actuator line conductor 46 and to provide an output signal. In the preferred embodiment, the current characteristics that is monitored is the inductive reactance of the coil as measured by changes in the current, such as changes in current and voltage, but any appropriate characteristic may be monitored. The detected change is an "identifiable anomaly" in the characteristic being measured.

That is, the current to the at least one actuator 40 has a number of characteristics such as inductance. The current characteristics have predictable changes. For example, when the at least one actuator 40 is being used to advance the needle 42, the inductance of the current may be measured and, if displayed, may be seen as an identifiable and known wave. Further, the current characteristics may also reflect random changes, generally identified as "noise." The noise may be detected and, if displayed, may be seen as anomalies in a regular pattern. There are, however, "identifiable anomalies" that are produced as a result of a specific action.

For example, if the closing stepping solenoid 100B is advancing, i.e. moving the solenoid 38 forward and the actuator member 58 seats against the solenoid 38, as described above, there is a mechanical feedback from the closing stepping solenoid 100B. This feedback to the closing stepping solenoid 100B produces an anomaly in the characteristics of the current and voltage in the at least one actuator line conductor 46. Moreover, this anomaly, or a substantially similar anomaly, occurs each time the actuator member 58 seats against the solenoid 38 while the closing stepping solenoid 100B is advancing. This specific anomaly only occurs when the spray gun 10 is in the calibration configuration. As such, this anomaly is an "identifiable anomaly" that is different from the normal characteristics of the current in the at least one actuator line conductor 46 as well as different from the characteristics of random noise. Accordingly, as used herein, an "identifiable anomaly" is an anomaly in the current and voltage in the at least one actuator line conductor 46 that has been associated with a known physical condition, configuration, or state of a stepping solenoids 100A, 100B. More specifically, a "solenoid seating anomaly" is an anomaly current in the at least one actuator line conductor 46 that has been determined to occur when the actuator member 58 seats against the solenoid 38. Generally, an anomaly becomes associated with a condition based on experimentation and verifying that a specific, distinct anomaly occurs each time the stepping solenoids 100A, 100B are placed in a specific physical condition, configuration, or state. Preferably, the identifiable anomaly associated with the actuator member 58 seating against the solenoid 38 is a change in inductance identified by changes in current and voltage.

It is noted that the current characteristics have been identified as being measurable and displayed in the form of a wave. While a monitor (not shown) may be provided and the wave displayed, this is not required. That is, as is known, the actuator control system 44 may be structured to detect the wave and any anomalies without actually creating a visual image of the wave and/or anomaly.

The calibration module 84 is a set of instructions structured to be executed by the actuator control system 44 and, more specifically by actuator control system PLC 48. As with the description of the PLC 48, it is beyond the scope of this document to describe in detail how a module interacts with the PLC 48, however, as is known, the module 84 is executed with the PLC 48 and may be described as performing, or as being structured to perform, selected operations and functions. Thus, as described above, the needle position module 76 is structured to track the "virtual" position of the needle 42. The calibration module 84 is, preferably, executed infrequently. For example, the calibration module 84 may be executed based on a period of time, e.g. every two weeks, or, after a certain number of operations, e.g. every 2 million actuations of the stepping solenoids 100A, 100B. The calibration module 84 is structured to reset the virtual needle position, i.e. zero the needle position module 76, to reflect the actual needle position. Preferably, the calibration module 84 clears all data in the needle position module register 77. Alternately, the calibration module 84 may update the last entry in the needle position module register 77 so as to indicate the spray gun 10 as being in the initial configuration. That is, when operation of the spray gun 10 is initiated, the spray gun is in the initial configuration. As the stepping solenoids 100A, 100B are utilized, the needle position module 76 records the virtual needle position data, as described above. Over time, the virtual needle position no longer corresponds to the actual needle position and the needle position must be calibrated. This is accomplished by executing the calibration module 84 which first places the solenoid 38 in the calibration configuration.

During this operation, the calibration module 84 monitors the at least one actuator line conductor 46 for an identifiable anomaly indicating that the actuator member 58 has seated against the solenoid 38. When the identifiable anomaly is detected, the forward motion of the closing stepping solenoid 100B is arrested and the calibration module 84 returns the spray gun 10 to the initial configuration, as described above, and zeros the needle position module 76 so that the needle position module 76 identifies the current spray gun configuration as the initial configuration. At this point, the needle 42 position is calibrated and the spray gun 10 may be returned to normal operations. It is noted that, unlike prior manual calibration methods, this may be accomplished while the fluid chamber 20 is filled with liquid product. That is, the calibration module 84 is operable when the fluid chamber 20 is filled with fluid.

The at least two actuators, 36, 40 and the actuator control system 44 are, preferably, substantially disposed in the operating mechanism chamber 68. That is, portions of the at least one actuator 40 and the actuator control system 44 may extend beyond the operating mechanism chamber 68. For example, the solenoid rod 56 and/or the needle 42 extends from the operating mechanism chamber 68 into the fluid chamber 20. The bulk of the at least one actuator 40 and the actuator control system 44 are, however, disposed in the operating mechanism chamber 68. Further, the actuator sensor 82 is disposed entirely within the operating mechanism chamber 68, and is preferably part of amplifier 50. In this configuration, the spray gun 10 is not coupled to an external control system. It is noted that the actuator control system 44 and the actuator sensor 82 are disposed close to the stepping solenoid assembly 100 so as to reduce the "noise" in the conductors that may interfere with detecting an identifiable anomaly.

Accordingly, and using the components described above, a method of calibrating needle lift in a spray gun 10 includes the following steps: placing 200 the spray gun 10 in a calibration configuration, monitoring 202 the current in the stepping solenoid assembly 100 having a line conductor 46, detecting 204 an identifiable anomaly in the current's characteristics, placing 205 the spray gun 10 in an initial configuration, and zeroing 206 the needle position module 76.

As noted above, the needle position module 76 is structured to record a number of pulses sent to the stepping solenoid assembly 100. Thus, the step of zeroing 206 the needle position module 76 so as to record the spray gun 10 configuration as the initial configuration may include the step of changing 212 the total value of recorded pulses to zero. This change may be accomplished by adding a number of pulses, with an associated direction, to the recorded needle position data so that the sum of the needle position data equals zero. Alternatively, the step of zeroing 206 the needle position module 76 so as to record the spray gun 10 configuration as the initial configuration may include the step of clearing 214 the needle position module register 77, wherein "clearing" means deleting all entries in the needle position module register 77. Further, as noted above, the four steps of the calibration 200, 202, 204, and 206, may occur when the fluid chamber 20 is filled with a liquid.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A system for calibrating needle lift in a spray gun assembly, said spray gun assembly having a housing and an operating mechanism, said housing defining at least a fluid chamber, said fluid chamber having a fluid inlet and a nozzle, said fluid chamber coupled to, and in fluid communication with, a fluid supply via said fluid inlet, said nozzle having an opening and a needle seat disposed about the inner surface of said nozzle opening, said operating mechanism having at least two electrically powered actuators, a needle and an actuator control system, said needle having a proximal end and a distal end, said needle proximal end coupled to said solenoid, said needle distal end shaped to sealingly engage said needle seat, said needle distal end disposed in said fluid chamber, said at least two actuators including a solenoid and a stepping solenoid assembly, said solenoid structured to move said needle between a first position, wherein said needle distal end sealingly engages said needle seat, and a second position wherein said needle distal end is spaced from said needle seat, said solenoid having a movable actuator member, said stepping solenoid assembly coupled to said solenoid with a solenoid spring disposed therebetween, said stepping solenoid assembly having a line conductor structured to be in electrical communication with a power source, said stepping solenoid assembly structured to receive input commands from said actuator control system and to incrementally move solenoid within said housing in response to said commands, said actuator control system structured to control said solenoid assembly and said solenoid so as to move said needle between said first position and said second position and said stepping solenoid assembly to provide fine adjustment to said needle position, said at least two actuators having an initial configuration and a calibration configuration, said system for calibrating needle lift comprising:

an actuator sensor structured to detect changes in the current in said stepping solenoid assembly line conductor and to provide an output signal;

a calibration module being executed in said actuator control system, said calibration module structured to receive said actuator sensor output signal;

a needle position module being executed in said actuator control system, said needle position module structured to track the virtual position of said needle; and said calibration module further structured to detect an identifiable anomaly in said sensor output signal, said identifiable anomaly indicative of said actuator member seating against said solenoid and, in response to detecting said identifiable anomaly, recording needle virtual position data indicating that the current position of said needle corresponds to the spray gun calibration configuration.

2. The system for calibrating needle lift in a spray gun assembly of claim 1 wherein said identifiable anomaly is a change in a current characteristic.

3. The system for calibrating needle lift in a spray gun assembly of claim 1 wherein said identifiable anomaly is a change in the inductive reactance of a stepping solenoid assembly coil as measured by changes in the current in said stepping solenoid assembly line conductor.

4. The system for calibrating needle lift in a spray gun assembly of claim 1 wherein said calibration module is operable when said fluid chamber is filled with fluid.

5. The system for calibrating needle lift in a spray gun assembly of claim 1 wherein said housing defines an operating mechanism chamber, said operating mechanism chamber being sealed from said fluid chamber and wherein said actuator sensor is disposed within said operating mechanism chamber.

6. The system for calibrating needle lift in a spray gun assembly of claim 1 wherein said identifiable anomaly is a solenoid seating anomaly.

7. The system for calibrating needle lift in a spray gun assembly of claim 1 wherein said actuator sensor is incorporated into an amplifier.

8. The system for calibrating needle lift in a spray gun assembly of claim 1 wherein, upon detection of an identifiable anomaly:
- said calibration module is structured to return said at least two actuators to said initial configuration; and
- said needle position module is zeroed.

9. A spray gun assembly having a system for calibrating needle lift comprising:
- a housing defining at least a fluid chamber;
- said fluid chamber having a fluid inlet, an excess fluid outlet and a nozzle, said fluid chamber structured to be coupled to, and in fluid communication with, a fluid supply via said fluid inlet;
- said nozzle having an opening and a needle seat disposed about the inner surface of said nozzle opening;
- an operating mechanism having at least two electrically powered actuators, a needle and an actuator control system;
- said at least two actuators including a solenoid and a stepping solenoid assembly;
- said solenoid having a movable actuator member coupled to said needle and being structured to move said needle between a first position, wherein said needle distal end sealingly engages said needle seat, and a selected position wherein said needle distal end is spaced from said needle seat;
- said actuator control system structured to control said at least two actuators so as to move said needle between said first position and a selected position;
- said stepping solenoid assembly having a line conductor structured to be in electrical communication with a power source, said stepping solenoid assembly structured to receive input commands from said actuator control system and to incrementally move said needle in response to said commands;
- said needle having a proximal end and a distal end, said needle proximal end coupled to said solenoid, said needle distal end shaped to sealingly engage said needle seat, said needle distal end disposed in said fluid chamber;
- said stepping solenoid assembly coupled to said solenoid via a solenoid spring, and structured to move said solenoid within said spray gun housing;
- said solenoid and stepping solenoid assembly having an initial configuration and a calibration configuration;
- a system for calibrating needle lift including an actuator sensor, a calibration module, and a needle position module;
- said actuator sensor structured to detect changes in the current in said stepping solenoid assembly line conductor and to provide an output signal;
- said calibration module being executed in said actuator control system, said calibration module structured to receive said actuator sensor output signal;
- said needle position module being executed in said actuator control system, said needle position module structured to track the virtual position of said needle; and
- said calibration module further structured to detect an identifiable anomaly in said sensor output signal, said anomaly indicative of said actuator member seating against said solenoid and, in response to detecting said identifiable anomaly, recording needle virtual position data indicating that the current position of said needle corresponds to the spray calibration configuration.

10. The spray gun assembly of claim 9 wherein:
- said identifiable anomaly is a change in a current characteristic.

11. The spray gun assembly of claim 9 wherein said identifiable anomaly is a change in the inductive reactance of the coil as measured by changes in the current.

12. The spray gun assembly of claim 9 wherein said calibration module is operable when said fluid chamber is filled with fluid.

13. The spray gun assembly of claim 9 wherein said housing defines an operating mechanism chamber, said operating mechanism chamber being sealed from said fluid chamber and wherein said at least one actuator and said actuator control system are substantially disposed in the operating mechanism chamber.

14. The system for calibrating needle lift in a spray gun assembly of claim 9 wherein said identifiable anomaly is a solenoid seating anomaly.

15. The system for calibrating needle lift in a spray gun assembly of claim 9 wherein said actuator sensor is incorporated into an amplifier.

16. The system for calibrating needle lift in a spray gun assembly of claim 9 wherein, upon detection of an identifiable anomaly:
- said calibration module is structured to return said at east two actuators to said initial configuration; and
- said needle position module is zeroed.

17. A system for calibrating needle lift in a spray gun assembly comprising:
- an actuator sensor structured to detect changes in a current in a stepping solenoid assembly line conductor and to provide an output signal;
- a calibration module structured to receive said actuator sensor output signal;
- said calibration module further structured to detect an identifiable anomaly in said sensor output signal and, in response to detecting said identifiable anomaly, recording needle virtual position data indicating that the current position of a needle corresponds to a spray gun calibration configuration.

18. The system for calibrating needle lift in a spray gun assembly of claim 17 wherein said identifiable anomaly is a change in a current characteristic.

19. The system for calibrating needle lift in a spray gun assembly of claim 17 wherein said identifiable anomaly is a change in the inductive reactance of a stepping solenoid assembly coil as measured by changes in the current in a stepping solenoid assembly line conductor.

20. The system for calibrating needle lift in a spray gun assembly of claim 17 wherein said identifiable anomaly is a solenoid seating anomaly.

* * * * *

UNITED STATES PATENT AND TRADEMARK OFFICE
CERTIFICATE OF CORRECTION

| | |
|---|---|
| PATENT NO. | : 9,238,242 B2 |
| APPLICATION NO. | : 14/307915 |
| DATED | : January 19, 2016 |
| INVENTOR(S) | : Neil A. Zumberger et al. |

It is certified that error appears in the above-identified patent and that said Letters Patent is hereby corrected as shown below:

Specification
Column 1, line 33, "specific type of type of" should read --specific type of--.
Column 4, line 42, "Once, the" should read --Once the--.
Column 4, line 60, "inductance; It" should read --inductance. It--.
Column 5, line 45, "14, Preferably," should read --14. Preferably,--.
Column 5, line 53, "24, The" should read --24. The--.
Column 5, line 65, "gusto-conical" should read --frusto-conical--.
Column 6, line 38, "rod 56 rod to" should read --rod 56 to--.
Column 9, line 24, "to move" should read --moves--.
Column 11, line 31, "on" should read --so--.
Column 11, line 65, "number pulses" should read --number of pulses--.
Column 15, line 31, "in the example" should read --In the example--.
Column 15, line 44, "characteristics" should read --characteristic--.
Column 16, line 12, "of a stepping" should read --of stepping--.

Signed and Sealed this
Seventh Day of June, 2016

Michelle K. Lee
*Director of the United States Patent and Trademark Office*